United States Patent
Scarsbrook et al.

(10) Patent No.: US 9,518,338 B2
(45) Date of Patent: Dec. 13, 2016

(54) SINGLE CRYSTAL DIAMOND

(75) Inventors: Geoffrey Alan Scarsbrook, Ascot (GB); Philip Maurice Martineau, Littlewick Green (GB); Daniel James Twitchen, Sunningdale (GB)

(73) Assignee: Element Six Technologies Limited, Didcot (GB)

( * ) Notice: Subject to any disclaimer, the term of this patent is extended or adjusted under 35 U.S.C. 154(b) by 2411 days.

(21) Appl. No.: 11/743,680

(22) Filed: May 3, 2007

(65) Prior Publication Data

US 2008/0085233 A1    Apr. 10, 2008

Related U.S. Application Data

(63) Continuation of application No. 10/665,550, filed on Sep. 22, 2003, now abandoned.

(30) Foreign Application Priority Data

Sep. 20, 2002 (GB) .................................. 0221949.1

(51) Int. Cl.
*C01B 31/06* (2006.01)
*C30B 25/02* (2006.01)
*C30B 33/00* (2006.01)
*C30B 29/04* (2006.01)

(52) U.S. Cl.
CPC ............... *C30B 25/02* (2013.01); *C30B 29/04* (2013.01); *C30B 33/00* (2013.01)

(58) Field of Classification Search
USPC .................................. 423/446; 117/79, 929
See application file for complete search history.

(56) References Cited

U.S. PATENT DOCUMENTS

| 5,127,983 | A | 7/1992 | Imai et al. |
|---|---|---|---|
| 5,360,479 | A | 11/1994 | Banholzer et al. |
| 5,474,021 | A * | 12/1995 | Tsuno et al. .................... 117/97 |
| 5,753,038 | A | 5/1998 | Vichr et al. |
| 2002/0028564 | A1 | 3/2002 | Motoki et al. |
| 2004/0175499 | A1 | 9/2004 | Twitchen et al. |
| 2004/0180205 | A1 | 9/2004 | Scarsbrook et al. |
| 2004/0182308 | A1 | 9/2004 | Scarsbrook et al. |
| 2004/0194690 | A1 | 10/2004 | Twitchen et al. |

(Continued)

FOREIGN PATENT DOCUMENTS

| EP | 0 316 856 A1 | 5/1989 |
|---|---|---|
| EP | 0 589 464 A1 | 3/1994 |

(Continued)

OTHER PUBLICATIONS

Definition of Rectangle, accessed online at <http://www.thefreedictionary.com/rectangle> on Mar. 8, 2014.*

(Continued)

*Primary Examiner* — Daniel C McCracken
(74) *Attorney, Agent, or Firm* — Dean W. Russell; Clark F. Weight; Kilpatrick Townsend & Stockton LLP

(57) ABSTRACT

A method of producing a large area plate of single crystal diamond from CVD diamond grown on a substrate substantially free of surface defects by chemical vapor deposition (CVD). The homoepitaxial CVD grown diamond and the substrate are severed transverse to the surface of the substrate on which diamond growth took place to produce the large area plate of single crystal CVD diamond.

11 Claims, 2 Drawing Sheets

(56) References Cited

U.S. PATENT DOCUMENTS

| | | |
|---|---|---|
| 2004/0221795 A1 | 11/2004 | Scarsbrook et al. |
| 2004/0229464 A1 | 11/2004 | Godfried et al. |

FOREIGN PATENT DOCUMENTS

| | | |
|---|---|---|
| EP | 0 615 954 A1 | 9/1994 |
| EP | 0 715 885 A2 | 6/1996 |
| EP | 879904 A1 | 11/1998 |
| JP | 1-103994 | 4/1989 |
| JP | 1-131014 | 5/1989 |
| JP | 03-075298 A | 3/1991 |
| JP | 6-107494 | 4/1994 |
| JP | 6-263418 | 9/1994 |
| JP | 7-277890 | 10/1995 |
| JP | 9-165295 | 6/1997 |
| JP | 11-1392 | 1/1999 |
| JP | 11-300194 | 11/1999 |
| JP | 2002-029897 | 1/2002 |
| WO | WO 01/96634 A1 | 12/2001 |

OTHER PUBLICATIONS

P. Kania, et al., Diamond and Related Materials, vol. 4, pp. 425-428 (1995).
English translation of "Characterization of thick homoepitaxial film on diamond (001) substrate II".
English translation of "Homoepitaxial growth of diamond (001) with nitrogen doping".
J. Michler, et al., J. Appl. Phys., vol. 83, No. 1, pp. 187-197 (1998).
R. Locher, et al., Appl. Phys. Lett., vol. 65, No. 1, pp. 34-36 (1994).
I.I. Vlasov, et al., Phys. Stat. Sol, vol. (a)181, No. 83, pp. 83-90 (2000).
P.E. Pehrsson, et al., Mat. Res. Soc. Symp, Proc., vol. 416, pp. 51-56 (1996).
U.S. Appl. No. 12/245,002, filed Oct. 3, 2008, Scarsbrook, et al.
Office Action issued Jun. 7, 2011, in Japanese Patent Application No. 2004-537433.

* cited by examiner

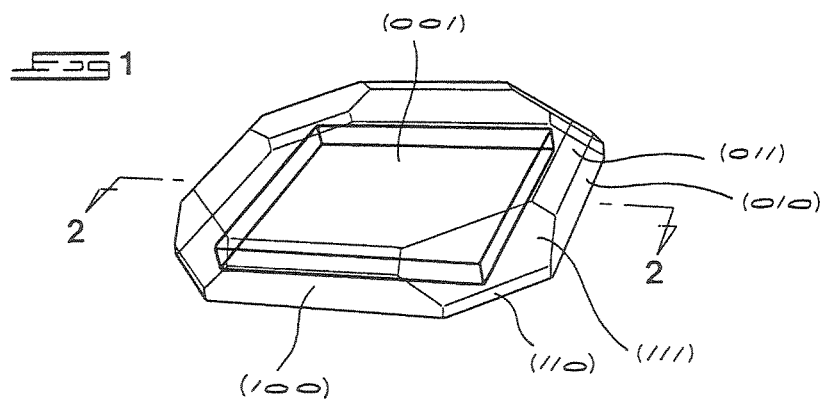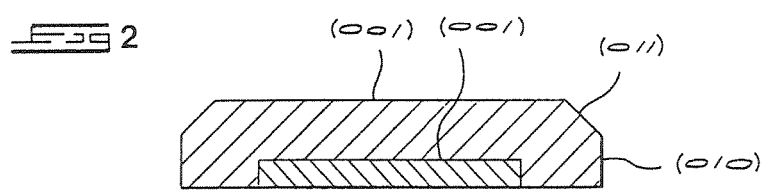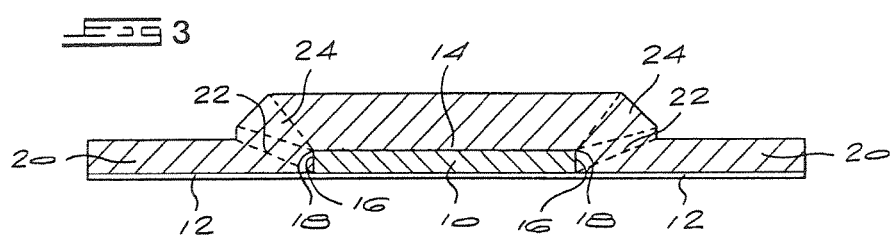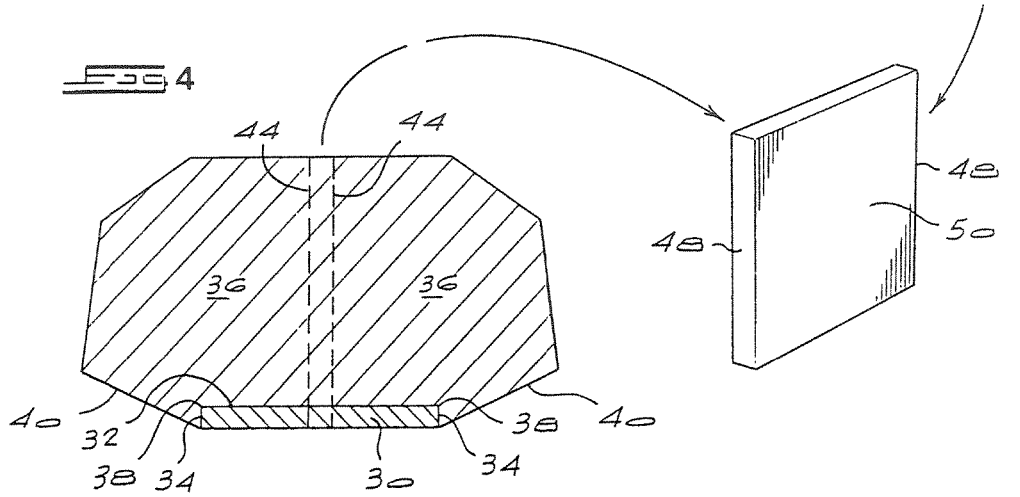

SINGLE CRYSTAL DIAMOND

This is a continuation application of U.S. application Ser. No. 10/665,550, filed Sep. 22, 2003.

BACKGROUND OF THE INVENTION

This invention relates to single crystal diamond.

Diamond offers a range of unique properties, including optical transmission, thermal conductivity, stiffness, wear resistance and its electronic properties. Whilst many of the mechanical properties of diamond can be realised in more than one type of diamond, other properties are very sensitive to the type of diamond used. For example, for the best electronic properties CVD single crystal diamond is important, often outperforming polycrystalline CVD diamond, HPHT diamond and natural diamond.

In many applications of diamond the limited lateral dimensions of the diamond available is a substantial limitation. Polycrystalline CVD diamond layers have substantially removed this problem for applications where the polycrystalline structure is suitable for the application, but in many applications polycrystalline diamond is unsuitable.

Whilst natural and HPHT diamond may not be suitable for some applications, they are used as substrates on which to grow CVD diamond. Although substrates can have a variety of crystallographic orientation, the largest and most suitable substrate orientation which can be produced for growth of high quality CVD diamond is generally (001). Throughout this specification, the Miller indices $\{hk1\}$, defining a plane based on the axes x,y,z will be written assuming that the z direction is that normal to the substrate surface and parallel to the growth direction. The axes x,y are then within the plane of the substrate, and are generally equivalent by symmetry but distinct from z because of the growth direction.

Large natural single crystal diamond is extremely rare and expensive, and large natural diamond substrate plates suitable for CVD diamond growth have not been demonstrated because of the associated very high economic risk in their fabrication and use. Natural diamond is often strained and defective, particularly so in larger substrate plates, and this causes twins and other problems in the CVD overgrowth or fracture during synthesis. In addition, dislocations which are prevalent in the natural diamond substrate are replicated in the CVD layer, also degrading its electronic properties.

HPHT synthetic diamond is also limited in size, and generally is of poorer quality in the larger stones, with inclusions being a major problem. Larger plates fabricated from synthetic diamonds generally exhibit missing corners so that edge facets other than $\{100\}$ (such as $\{110\}$) are present, or they are included or strained. During synthesis further facets are formed, such as the $\{111\}$ which lies between the (001) top face and the $\{110\}$ side facets (see FIG. 1 of the accompanying drawings). In recent years significant effort has been directed at synthesising HPHT diamond of high quality for applications such as monochromators, and some progress has been reported, but the size of HPHT plates suitable for substrates remains limited.

$\{111\}$ faces in particular are known generally to form twins during CVD synthesis of thick layers, limiting the area of perfect single crystal growth and often leading to degradation and even fracture during synthesis, further exacerbated by thermal stresses resulting from the growth temperature. Twinning on the $\{111\}$ particularly interferes with increasing the size of the largest plate which can be fabricated with a (001) major face and bounded by $\{100\}$ side faces.

Routinely available (001) substrates range up to about 7 mm square when bounded by $\{100\}$ edges, and up to about 8.5 mm across the major face when bounded by $\{100\}$ and $\{110\}$ edges.

CVD homoepitaxial synthesis of diamond involves growing CVD epitaxially on an existing diamond plate and is well described in the literature. This is of course still limited by the availability of existing diamond plates. In order to achieve larger areas, the focus has been to grow laterally as well, increasing the overall area of the overgrown plate. Such a method is described in EP 0 879 904.

An alternative to homoepitaxial growth is heteroepitaxial growth, where a non-diamond substrate is grown on with an epitaxial relationship. In all reported cases however, the product of this process is quite distinct from homoepitaxial growth, with low angle boundaries between highly oriented but not exactly oriented domains. These boundaries severely degrade the properties of the diamond.

Homoepitaxial diamond growth to enlarge the area of a CVD plate presents many difficulties.

If it was possible to achieve ideal homoepitaxial growth on a diamond plate, the growth which would be achieved is substantially that illustrated by FIGS. 1 and 2 of the accompanying drawings. The growth morphology illustrated assumes that there is no competing polycrystalline diamond growth. However, in reality, there is generally competition from polycrystalline growth, growing up from the surface on which the diamond substrate plate is mounted. This is illustrated by FIG. 3 of the accompanying drawings.

Referring to FIG. 3, a diamond substrate plate 10 is provided mounted on a surface 12. Example materials for surface 12 include molybdenum, tungsten, silicon and silicon carbide. During CVD diamond growth, single crystal diamond growth will occur on the (001) face 14 and on the side surfaces, two of which 16 are shown. The side surfaces 16 are $\{010\}$ surfaces. Growth will also occur on and extend outwards from the corners and vertices 18 of the plate. All such growth will be homoepitaxial single crystal growth. The growth on each of the faces present on the substrate, and on any new surfaces generated during growth, constitutes a growth sector. For example, in FIG. 3 diamond growth 24 arises from the $\{101\}$ plane and thus is the $\{101\}$ growth sector.

Competing with the homoepitaxial single crystal growth will be polycrystalline diamond growth 20 which will take place on the surface 12. Depending on the thickness of the single crystal diamond layer produced on the surface 14, the polycrystalline diamond growth 20 may well meet the homoepitaxial single crystal diamond growth along line 22, as illustrated in FIG. 3.

Based on FIG. 2, one might expect that the purely lateral growth on the substrate side surfaces could be used to fabricate a larger substrate, including the material of the original substrate. However, as is clear from FIG. 3, such a plate would actually contain competing polycrystalline growth. A plate fabricated parallel to the original substrate, but higher up in the grown layer is likely to contain twinning, especially from material in the $\{111\}$ growth sector.

Under growth conditions where polycrystalline diamond does not compete with the single crystal diamond there still remains the problem that the quality of the lateral single crystal growth is generally poor, as a result of the different geometry and process conditions present at the diamond substrate edges, exacerbated by the method used to suppress polycrystalline growth.

Defects in the substrate used for CVD diamond growth replicate into the layer grown thereon. Clearly, since the process is homoepitaxial, regions such as twins are continued in the new growth. In addition, structures such as dislocations are continued, since by its very nature a line dislocation cannot simply self terminate, and the probability of two opposite dislocations annihilating is very small. Each time a growth process is initiated, additional dislocations are formed, primarily at heterogeneities on the surface, which may be etch pits, dust particles, growth sector boundaries and the like. Dislocations are thus a particular problem in single crystal CVD diamond substrates, and in a series of growths in which the overgrowth from one process is used as the substrate for the next, the density of dislocations tends to increase substantially.

SUMMARY OF THE INVENTION

According to the present invention, a method of producing a plate of single crystal diamond includes the steps of providing a diamond substrate having a surface substantially free of surface defects, growing diamond homoepitaxially on the surface by chemical vapour deposition (CVD) and severing the homoepitaxial CVD grown diamond and the substrate transverse, typically normal (that is, at or close to 90°), to the surface of the substrate on which diamond growth took place to produce a plate of single crystal CVD diamond.

The homoepitaxial CVD diamond growth on the surface of the substrate preferably takes place by the method described in WO 01/96634. Using this method, in particular, it is possible to grow thick, high purity single crystal diamond on a substrate. A growth thickness of the homoepitaxial grown CVD diamond of greater than 10 mm, preferably greater than 12 mm, and more preferably greater than 15 mm, can be achieved. Thus, it is possible, by the method of the invention, to produce single crystal CVD diamond plates having at least one linear dimension exceeding 10 mm, preferably exceeding 12 mm and more preferably exceeding 15 mm. By "linear dimension" is meant any linear measurement taken between two points on or adjacent to the major surfaces. For instance, such linear dimension may be the length of an edge of the substrate, a measurement from one edge, or a point on the edge, to another edge, or another point on the edge, an axis or other like measurement.

In particular, it is possible by the method of the invention to produce rectangular (001) single crystal diamond plates which are bounded by {100} side surfaces or faces which have at least one linear dimension, such as a linear <100> edge dimension, exceeding 10 mm, preferably exceeding 12 mm and more preferably exceeding 15 mm.

The plate of single crystal CVD diamond produced by the method may then itself be used as a substrate in the method of the invention. Thick single CVD crystal diamond can be grown homoepitaxially on a major surface of the plate.

The invention provides, according to another aspect, a (001) single crystal CVD diamond plate having major surfaces on opposite sides thereof bounded by {100} side surfaces, i.e. a plate in which the major surfaces are {001} faces, each major surface having at least one linear dimension exceeding 10 mm. In one form of the invention, the plate has a rectangular, square, parallelogram or like shape, at least one of the side surfaces of which, and preferably both side surfaces, has a dimension exceeding 10 mm, preferably exceeding 12 mm and more preferably exceeding 15 mm. Most preferable is that these side surfaces are {100} surfaces or faces, such that the plate edge dimension (or dimensions) exceeding 10 mm is in the <100> direction. Further, the method of the invention provides for a larger plate or piece of diamond from which such a plate bounded by {100} side surfaces and {001} major surfaces can be fabricated.

In the homoepitaxial diamond growth which occurs on the surface of the diamond substrate, any dislocations or defects in that surface, or arising at the interface with the substrate, or from the edges of the substrate, generally propagate vertically in the diamond growth. Thus, if the severing takes place substantially normal to the surface on which diamond growth took place, then the severed surface will have substantially no dislocations within the material intersecting the surface, as they will be running generally parallel to the surface. Thus a reduction in the dislocation density in the volume of the material can be achieved by repeating the method using this new plate as the substrate, and a resulting further reduction in the density of dislocations cutting the major surface of any plates cut normal to this substrate. Furthermore, there are applications that benefit from plates in which the dislocations that are present run generally parallel to the major faces rather than generally normal to them.

Generally the highest quality CVD growth is that contained within the vertical (001) growth sector. Furthermore, since the edges of the substrate can form dislocations and these generally rise vertically upwards, then the highest quality volume of the CVD growth is that bounded by the vertical planes rising up from the substrate edges. The method of this invention enables one or more new large area plates to be fabricated from entirely within this volume, thus minimising the defects within the plate, and maximising its crystal quality.

Combining the various features of this invention, it is possible to produce diamond with a lower dislocation density than the starting substrate material, with the lower limit on dislocation density set only by the number of times the method is to be repeated. In particular, the large area plate of the invention and any layers subsequently synthesised on it can have a dislocation density, typically intersecting a surface normal to the growth direction (this surface generally showing the highest dislocation density in CVD diamond), which is less than $50/mm^2$, and preferably less than $20/mm^2$, and more preferably less than $10/mm^2$ and even more preferably less than $5/mm^2$. The defect density is most easily characterised by optical evaluation after using a plasma or chemical etch optimised to reveal the defects (referred to as a revealing plasma etch), using for example a brief plasma etch of the type described in WO 01/96634. In addition, for applications in which the dislocation density intersecting the major face of the plate is of primary concern, then a plate fabricated by the method of this invention can exhibit a dislocation density on its major face which is less than $50/mm^2$, and preferably less than $20/mm^2$, and more preferably less than $10/mm^2$ and even more preferably less than $5/m^2$.

Where the substrate is a natural or HPHT synthetic substrate, it is generally not advantageous for the normally cut plate to include the material from the original substrate, although this can be done. It can be advantageous to include material from the substrate in this plate when the substrate is itself a CVD diamond plate, which may itself have been prepared by this method.

BRIEF DESCRIPTION OF THE DRAWINGS

FIG. 1 is a schematic perspective view of a diamond plate on which ideal homoepitaxial diamond growth has taken place;

FIG. 2 is a section along the line 2-2 of FIG. 1;

FIG. 3 is a section through a diamond plate illustrating single crystal diamond growth and polycrystalline diamond growth;

FIG. 4 is a section through a diamond plate on which homoepitaxial diamond growth according to an embodiment of the invention has taken place;

DESCRIPTION OF AN EMBODIMENT

Figure 5:
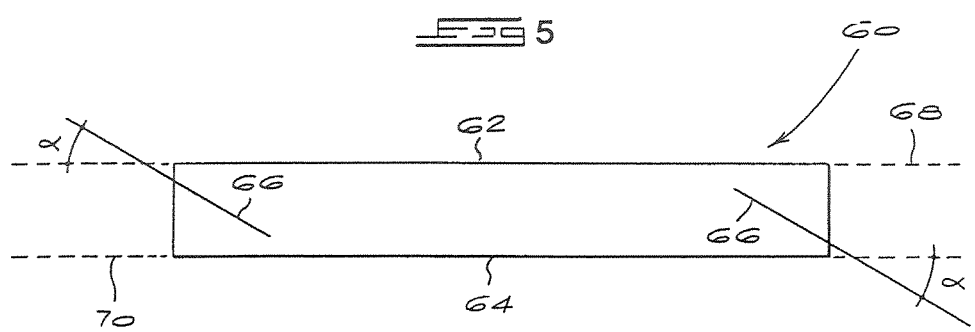
FIG. 5 is a schematic of a diamond plate showing the angle α of the dislocation direction relative to the major surfaces of the diamond plate.

An embodiment of the invention will now be described with reference to the accompanying drawings. Referring to FIG. 4, a diamond plate 30 is provided. The diamond plate 30 is a plate of single crystal diamond. The upper face 32 is the (001) face and the side surfaces 34 are {010} faces. The surface 32 is substantially free of surface defects, more particularly substantially free of crystal defects as described in WO 01/96634.

Following the method described in WO 01/96634, diamond growth 36 takes place on the diamond substrate 30. This diamond growth occurs vertically on the upper surface 32, outwards from the corners 38 of the substrate 30 and outwards from the side surfaces 34. This diamond growth will generally be homoepitaxial, single crystal and of high quality, although dislocations and twinning on the {111} may be present as described earlier.

Inevitably, some polycrystalline diamond growth will occur on the surface on which the substrate is placed. This polycrystalline diamond growth may, depending on the thickness of the diamond growth region 36, meet the lower surface 40 of this region.

Once a desired thickness of diamond growth 36 has taken place, the diamond growth region 36 and substrate 30 are severed normal (at approximately 90°) to the surface 32, as illustrated by dotted lines 44. This produces a plate 46 of high quality single crystal diamond. The interface between the original substrate and the diamond growth will, for practical purposes, be indistinguishable from the bulk of the sample. The original substrate material may form part of plate 46 or be removed from it. More than one plate may be produced, with each plate parallel to the next and normal to the substrate.

Using the method of WO 01/96634, it is possible to produce a diamond growth region 36 which exceeds 10 mm in depth. Thus, the diamond plate 46 which is produced will have side surfaces 48 which exceed 10 mm in length.

The plate 46 may be used as a substrate for the method of the invention. Thus, if the plate 46 has side surfaces 48 greater than 10 mm in length and diamond growth exceeding 10 mm in thickness is produced on the major surface 50 of the plate, it is possible to produce a square, rectangular or similar shaped plate which has all four side surfaces exceeding 10 mm in length.

Severing in FIG. 4 is shown to take place perpendicular to the surface 32. Severing can take place at angles other than perpendicular to the surface 32, excluding plates which are parallel to the substrate. Plates produced at angles other than normal to the substrate, where the substrate has a (001) major face, will have major faces other than the {100}, such as the {110}, {113}, {111} or higher order planes.

Further, it is possible to sever along planes which are at right angles to the sever planes 44 of FIG. 4, which will also form a plate with a major {100} face, or at any other angle relative to the sever planes 44, which will form plates with major faces of the type {hk0}. To achieve single crystal diamond plates, some trimming of polycrystalline or defective growth at the edges may be necessary.

Those skilled in the art will recognise that the general method need not be restricted to substrates with a (001) major face, but could equally be applied to other substrates with, for example, {110}, {113}, or even {111} major faces, but that in general the preferred method is to use a substrate with a (001) major face, since the highest quality CVD diamond growth can be most easily grown on this face and the disposition of facets formed on the growing CVD on this face is generally most appropriate for the production of large plates cut from the material grown.

For this reason, the key dimension in a substrate plate with a (001) major face is the largest rectangular plate which can be fabricated bounded only by {100} side faces. Growth on this plate can relatively easily produce the plate bounded by {110} side surfaces or faces which is rotated by 45°, as shown in FIG. 1, since this makes limited or no use of {111} growth sector material. This new plate, bounded by {110} side faces has an area which is at least double that of the {100} bounded plate, but the original {100} bounded plate generally remains the largest inscribed {100} bounded plate which can be fabricated from it. For this reason, reference to the size of a single crystal diamond plate with a (001) major face in this specification often explicitly refers to the size of the largest area inscribed rectangular plate bounded by {100} edges, if the plate does not already have {100} edges.

Application of the method of this invention enables the manufacture of products not previously possible. For instance, large area windows, where for reasons of clear aperture, support, mechanical integrity, vacuum integrity etc. an assembly of smaller windows will not suffice, are now possible. High voltage devices, where the large area provides the protection from arcing round the active area of the device, are also possible. The low dislocation density material of the invention further enables applications such as electronic devices in which dislocations act as charge carrier traps or electrical short circuits.

The growth direction of a CVD diamond layer can generally be determined from the dislocation structures within it. There are a range of configurations which can be present.

1) The simplest case is where the dislocations all grow largely parallel and in the direction of growth, making the growth direction clearly evident.

2) Another common case is where the dislocations fan out slowly about the growth direction, usually exhibiting some form of symmetry about the growth direction and at an angle typically less than 20°, and more typically less than 15°, and even more typically less than 100, and most typically less than 50 about this axis. Again from a small area of the CVD diamond layer the growth direction is easily determined from the dislocations.

3) On occasion, the growth face is not itself at right angles to the local growth direction, but at some small angle away from this. Under such circumstances the dislocations may be biased towards the direction normal to the substrate surface of the growth zone in which they are found. Particularly near edges, the growth direction may vary substantially from the bulk of the layer, for example at {101} edge bevels on a substrate with a {001} major growth face.

In both these instances, taken over the whole substrate the general growth direction is clearly evident from the dislocation structures, but equally evident is that the material is formed from more than one growth sector. In applications in which the directions of the dislocations is of importance, then it is generally desirable to use material from only one growth sector.

For the purposes of this specification, the direction of the dislocations is that direction which an analysis of the dislocation distribution would suggest to be the growth direction of the layer based on the above models. Typically and preferably, the direction of the dislocations within a particular growth sector will then be the mean direction of the dislocations using a vector average, and with at least 70%, more typically 80%, and even more typically 90% of the dislocations lying in a direction which is within 20°, more preferably 15°, even more preferably 10° and most preferably 5° of the mean direction.

The direction of dislocations can be determined for example by X-ray topography. Such methods do not necessarily resolve individual dislocations but may resolve dislocation bundles, generally with an intensity in part proportional to the number of dislocations in the bundle. Simple or preferably intensity weighted vector averaging is then possible from topographs imaging cross sections in the plane of the dislocation direction, with a topograph taken normal to that direction being distinct in having a pattern of points rather than lines. Where the original growth direction of a plate is known, then this is a sensible starting point from which to determine the dislocation direction.

Having determined the dislocation direction according to the above method, its orientation can be classified relative to the major faces of the single crystal CVD diamond plate. Referring to FIG. 5, a diamond plate 60 has opposite major surfaces 62 and 64. The direction of the dislocations, indicated generally by lines 66, is considered to be oriented generally parallel to the major faces 62,64 of the diamond plate 60 if the dislocations direction 66 makes an angle α of less than 30°, preferably less than 20°, more preferably less than 15°, even more preferably less than 10°, and most preferably less than 5° from a plane 68,70 of at least one of the major faces 62,64 of the plate 60. This orientation of dislocations is typically achieved when the single crystal CVD diamond plate is severed substantially perpendicular to the substrate on which growth took place, in particular when severed from the highest quality CVD growth contained within the vertical (001) growth sector.

Applications benefiting from the dislocation direction lying generally parallel to the major faces include optical applications where the effect on the variation of refractive index observed across a light beam passing through the plate is to substantially reduce the spread, compared to that when the same dislocation distribution is substantially normal to the major surfaces. Such applications benefit from being able to produce plates whose lateral dimensions both exceed 2 mm, more preferably 3 mm, even more preferably 4 mm, even more preferably 5 mm and even more preferably 7 mm, as is now made possible by the method of this invention.

Further applications benefiting from selecting the direction of the dislocations to be generally parallel to the major faces of the plate are in applications using high voltage, where dislocations can provide a short circuit in the direction of the applied voltage.

Another application is that of laser windows, where the effect of the beam travelling parallel to the dislocations can enhance local electric fields and result in failure. This can be controlled by either offsetting the dislocation direction from the beam direction, or preferably setting the dislocation direction parallel to the major faces of the laser window and thus at right angles to the incident laser beam. Thus the maximum laser damage threshold can be achieved by practicing the method of the invention.

Figure 6:
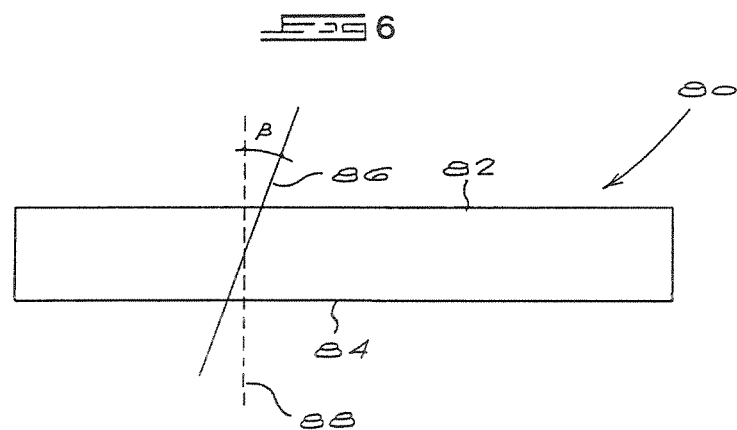
FIG. 6 is a schematic of a diamond plate showing the angle β of the dislocation direction relative to the normal to the major surfaces of the plate.

Another way of classifying the dislocation direction is its orientation relative to the normal to a major face of the plate. Referring to FIG. 6, a diamond plate 80 has opposite major surfaces 82 and 84. The dislocation direction 86 is considered to be offset away from the normal 88 to at least one of the major faces 82,84 of the plate if the angle β between the dislocation direction 86, determined by the above method, and the normal 88 exceeds 20°, more preferably exceeds 30, even more preferably exceeds 40°, and most preferably exceeds 50°. This orientation of dislocations is typically achieved when the single crystal CVD diamond plate is severed at an angle to the surface of the substrate on which growth took place. Alternatively, it may occur where the plate is severed substantially perpendicular to the substrate on which growth took place, but in a region where the growth face itself is not parallel to the original substrate surface, for instance in a {101} growth sector of a layer grown on a (001) substrate.

Substantial benefit can be achieved in certain applications by ensuring the dislocation direction is merely offset away from the normal to at least one of the major faces of the plate. Such requirements are found in the application of diamond to etalons.

This invention may be further understood by way of the following non-limiting examples.

Example 1

Two {001} synthetic diamond substrates were prepared for CVD diamond growth according to the method described in WO 01/96633. A layer was then grown onto these diamond substrates to a thickness of 6.7 mm. The layers were characterised for their dislocation direction, and it was found that >90% of dislocations visible by X-ray topography were within 20° of the growth direction, and >80% of the dislocations were within 10° of the growth direction.

One plate was cut out of each of these layers such that the major faces of each plate had dimensions>6×5 mm and the direction of growth was in the plane of the major faces.

One plate was then used for a second stage of CVD diamond growth, preparing it according to the method of WO 01/96633, thus producing a second layer which was in excess of 4 mm thick and suitable for the preparation of a 4×4 mm plate cut to include the growth direction in a major face. This layer was then characterised for it dislocation density in the direction of growth, by producing a small facet and using the method of a revealing plasma etch, which found the dislocation density to be very low and in the region of $10/mm^2$. This made the material particularly suited to the application of etalons.

Example 2

In optical applications, a key parameter is the uniformity and spread in values of properties such as birefringence and refractive index. These properties are affected by the strain fields surrounding dislocation bundles.

Two {001} synthetic diamond substrates were prepared for CVD diamond growth according to the method described in WO 01/96633. A layer was grown onto this diamond to a thickness of 4 mm. The layers were characterised for dislocation direction and it was found that the mean dislocation direction lay within 15° of the growth direction. Two plates were cut out of these layers such that the major faces of the plates had dimensions>4×4 mm and the direction of growth was in the plane of the major faces.

These layers were subsequently used for substrates in a second growth process. X-ray topography showed that the resulting growth (to a thickness of 3.5 mm) had a very low dislocation content, and that the dislocations in the new overgrowth were perpendicular to those in the original CVD layer used as the substrate. Subsequent to this second growth the samples were used in an optical application which required very low scatter and birefringence.

Example 3

A synthetic diamond substrate was prepared for CVD diamond growth according to the method described in WO 01/96633. A layer was then grown onto this diamond to a thickness of 7.4 mm. The synthesis conditions were such that this layer was boron doped to a concentration, as measured in the solid, of $7 \times 10^{16}$ [B] atoms/cm$^3$. The layer was characterised for its dislocation direction, with the mean dislocation direction found to be within 25° of the growth direction. Two plates were cut out of this layer such that the major faces of the plates had dimensions>4×4 mm and the direction of growth was in the plane of the major faces.

These plates, because of the low density of dislocations intersecting the major surfaces in combination with the boron doping, had particular use as substrates for electronic devices such as a diamond metal semiconductor field effect transistor (MESFET).

Example 4

A 6×6 mm synthetic substrate 1b was prepared using the method described in WO 01/96633 This substrate was then grown on in stages, typically adding about 3 mm of growth in each stage. At the end of each stage the layer was retained in the polycrystalline diamond layer that had grown around it, this polycrystalline layer being trimmed to a disc about 25 mm diameter using laser trimming, and then this disc mounted into a recessed tungsten or other metal disc such that the point where the single crystal was exposed above the polycrystalline diamond layer was approximately level (to within 0.3 mm) of the upper surface of the tungsten disc.

Using the above technique it was possible to grow layers with a final thickness in the range 10-18 mm, from which plates with {100} edges could be vertically cut. Plates were produced with a first <100> dimension in the plane of the plate of 10-16 mm, and a second orthogonal dimension of 3-8 mm.

These plates were then prepared as substrates and used for a second stage of growth, again using the above technique, to produce layers which were 10-18 mm thick. From these layers it was possible to cut vertical plates which were greater than 10-18 mm in the <100> second dimension within the major face and retaining the first <100> dimension in the range 10-18 mm. For example, plates were produced which were larger than 15 mm×12 mm, the dimensions being measured in orthogonal <100> directions.

We claim:

1. A method of producing a plate of single crystal diamond, which comprises providing a diamond substrate, growing diamond homoepitaxially on a surface of the substrate by chemical vapour deposition (CVD) and severing the homoepitaxial CVD grown diamond transverse to the surface of the substrate on which diamond growth took place to produce a plate of single crystal CVD diamond having side faces and major faces, the major faces being larger in area than the side surfaces, wherein the major faces are transverse to the surface of the substrate.

2. The method according to claim 1, wherein the homoepitaxial CVD grown diamond is severed normal to the surface of the substrate.

3. The method according to claim 1, wherein the growth thickness of the homoepitaxial CVD grown diamond is greater than about 10 mm.

4. The method according to claim 3, wherein the growth thickness of the homoepitaxial CVD grown diamond is greater than about 12 mm.

5. The method according to claim 4, wherein the growth thickness of the homoepitaxial CVD grown diamond is greater than about 15 mm.

6. The method according to claim 1, wherein the single crystal CVD diamond plate has at least one linear dimension exceeding 10 mm.

7. The method according to claim 1, wherein the diamond substrate is a plate of single crystal CVD diamond produced by the method according to claim 1.

8. The method according to claim 1, wherein any original substrate remaining in the single crystal CVD diamond plate is removed.

9. The method according to claim 1, wherein the single crystal CVD diamond plate has a rectangular, square, or parallelogram shape having major surfaces that are transverse to the surface of the substrate.

10. The method according to any one of claim 1 or 2, wherein in the step of severing the homoepitaxial CVD grown diamond the substrate is also severed.

11. The method according to claim 1, wherein the diamond substrate has a surface on which the homoepitaxial CVD diamond is grown that is substantially free of surface defects.

* * * * *